US012160084B2

(12) United States Patent
Hall et al.

(10) Patent No.: US 12,160,084 B2
(45) Date of Patent: Dec. 3, 2024

(54) MEMS-BASED PHASE SPATIAL LIGHT MODULATING ARCHITECTURE

(71) Applicant: Texas Instruments Incorporated, Dallas, TX (US)

(72) Inventors: James Norman Hall, Parker, TX (US); Terry Alan Bartlett, Dallas, TX (US); William Craig McDonald, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 982 days.

(21) Appl. No.: 16/653,026

(22) Filed: Oct. 15, 2019

(65) Prior Publication Data

US 2021/0111537 A1   Apr. 15, 2021

(51) Int. Cl.
H01S 5/00 (2006.01)
G02B 5/08 (2006.01)
G03B 21/00 (2006.01)
H01S 5/062 (2006.01)

(52) U.S. Cl.
CPC ............ *H01S 5/06246* (2013.01); *G02B 5/08* (2013.01); *H01S 5/0071* (2013.01)

(58) Field of Classification Search
CPC ..... H01S 5/06246; H01S 5/0071; G02B 5/08; G02B 26/0841; G03B 21/008
See application file for complete search history.

(56) References Cited

U.S. PATENT DOCUMENTS

| 5,212,582 A | 5/1993 | Nelson |
| 5,312,513 A | 5/1994 | Florence et al. |
| 5,606,441 A | 2/1997 | Florence et al. |
| 5,614,921 A | 3/1997 | Conner et al. |
| 5,719,695 A | 2/1998 | Heimbuch |
| 6,028,689 A * | 2/2000 | Michalicek ........ G02B 26/0841 359/223.1 |
| 6,329,738 B1 | 12/2001 | Hung et al. |
| 6,501,588 B1 | 12/2002 | Rosa et al. |

(Continued)

FOREIGN PATENT DOCUMENTS

| CN | 102981272 A | 3/2013 |
| JP | 2013171219 A | 9/2013 |

OTHER PUBLICATIONS

R.W. Gerchberg and W.O.Sexton, "A Practical Algorithm for the Determination of Phase From Image and Diffraction Plane Pictures", Optik, vol. 35, No. 2, (1972), retrieved Oct. 14, 2019 from the uniform resource locator (URL):https://antoine.wojdyla.fr/assets/archive/gerchberg_saxton1972.pdf.

(Continued)

*Primary Examiner* — Xinning(Tom) Niu
(74) *Attorney, Agent, or Firm* — Michelle F. Murray; Frank D. Cimino

(57) ABSTRACT

Described examples include apparatus having a driving electrode on a substrate. The apparatus has a platform suspended above the driving electrode and conductively coupled to a platform electrode, where the platform is configured to move in a direction perpendicular to a surface of the substrate in response to a voltage difference applied between the driving electrode and the platform electrode. The apparatus also has a mirror post on the platform. The apparatus has a mirror coupled to the platform by the mirror post, where the mirror is rectangular.

20 Claims, 10 Drawing Sheets

(56) References Cited

U.S. PATENT DOCUMENTS

| | | |
|---|---|---|
| 6,542,282 B2 | 4/2003 | Smith et al. |
| 6,625,343 B2 | 9/2003 | Kato |
| 6,695,457 B2 * | 2/2004 | van Drieenhuizen ........................ G02B 26/0841 359/290 |
| 6,856,448 B2 * | 2/2005 | Fitzpatrick ......... G02B 26/0841 359/291 |
| 6,867,897 B2 | 3/2005 | Patel et al. |
| 6,897,991 B2 | 5/2005 | Huffman et al. |
| 7,106,491 B2 | 9/2006 | Meyer et al. |
| 7,477,440 B1 | 1/2009 | Huang |
| 7,977,897 B2 | 7/2011 | Schenk |
| 10,371,939 B2 * | 8/2019 | McDonald ......... G02B 26/0841 |
| 10,831,018 B2 | 11/2020 | Fruehling et al. |
| 2002/0057484 A1 | 5/2002 | Mori |
| 2003/0168928 A1 | 9/2003 | Clark et al. |
| 2004/0008396 A1 | 1/2004 | Stappaerts |
| 2004/0160118 A1 | 8/2004 | Knollenberg et al. |
| 2004/0248417 A1 | 12/2004 | Malone |
| 2005/0180686 A1 | 8/2005 | Patel et al. |
| 2006/0023994 A1 | 2/2006 | Ko et al. |
| 2006/0119922 A1 | 6/2006 | Faase et al. |
| 2007/0053052 A1 * | 3/2007 | Pan ........................ B81B 3/0086 359/291 |
| 2007/0101398 A1 | 5/2007 | Islam |
| 2007/0146376 A1 | 6/2007 | Miles |
| 2008/0013145 A1 | 1/2008 | Chui et al. |
| 2008/0122822 A1 | 5/2008 | Pan et al. |
| 2009/0079362 A1 | 3/2009 | Shteynberg |
| 2009/0128888 A1 | 5/2009 | Ichikawa et al. |
| 2009/0279163 A1 | 11/2009 | Kurozuka |
| 2010/0067094 A1 | 3/2010 | Sugimoto et al. |
| 2012/0126333 A1 | 5/2012 | Thomas |
| 2012/0236042 A1 | 9/2012 | Parmar |
| 2013/0136267 A1 | 5/2013 | Hammerschmidt |
| 2013/0147567 A1 | 6/2013 | Yamakawa |
| 2013/0278912 A1 * | 10/2013 | Owa .................... G02B 27/425 355/71 |
| 2013/0298670 A1 | 11/2013 | Tsugai |
| 2014/0160118 A1 | 6/2014 | Beaver, III |
| 2016/0203770 A1 | 7/2016 | Yoshizawa |
| 2017/0003392 A1 | 1/2017 | Bartlett et al. |
| 2017/0318385 A1 | 11/2017 | Harney |
| 2017/0328989 A1 | 11/2017 | Bartlett |
| 2019/0179134 A1 | 6/2019 | Fruehling et al. |
| 2020/0209614 A1 | 7/2020 | McDonald et al. |

OTHER PUBLICATIONS

Bifano, Thomas et. al., "Large-scale metal MEMS mirror arrays with integrated electronics", Design, Test, Integration and Packaging of MEMS/MOEMS 2002, Proceedings of the SPIE, vol. 4755, pp. 467-746, 2002; retrieved Oct. 15, 2019 from the uniform resource locator (URL): http://people.bu.edu/tgb/PDF_files/17_DTIPSLM.pdf.

Bartlett, Terry et. al., "Adapting Texas Instruments (TI) DLP technology to demonstrate a phase spatial light modulator", Emerging Digital Micromirror Device Based Systems and Applications XI, Proceedings of the SPIE, vol. 10932 (Mar. 4, 2019).

International Search Report for PCT/US2018/064754 dated Apr. 4, 2019, 3 pages.

International Search Report for PCT/US2018/064757 dated Apr. 11, 2019, 2 pages.

Extended Search Report for European Patent Application No. EP18885789.0, dated Feb. 21, 2017, 1 page.

CN102981272a, Machine English Translation, 14 pages.

Search Report for PCT Application No. PCT/US2020/055721, date of mailing of international search report dated Jan. 28, 2021, 1 page.

Non-Final Office Action dated Sep. 16, 2022, U.S. Appl. No. 17/093,277, 21 pages.

Non-Final Office Action dated Mar. 3, 2023, U.S. Appl. No. 17/120,687, filed Dec. 14, 2020, 49 pages.

Non-Final Office Action dated Jul. 19, 2023, U.S. Appl. No. 17/093,277, filed Nov. 9, 2020, 8 pages.

"Adapting Texas Instruments (TI) DLP Technology to Demonstrate a Phase Spatial Light Modulator," Proceedings of SPIE, vol. 10932, 109320S-1, 2019 SPIE, 13 pages.

Notification of First Office Action dated Jul. 21, 2023, Chinese Application No. 202080069718X, 18 pages.

Non-Final Office Action dated Jan. 31, 2024, U.S. Appl. No. 17/120,687, filed Dec. 14, 2020, 40 pages.

* cited by examiner

MEMS-BASED PHASE SPATIAL LIGHT MODULATING ARCHITECTURE

TECHNICAL FIELD

This relates generally to light modulation, and more particularly to examples to phase spatial light modulation.

BACKGROUND

Holographic projection projects an image to a specified distance or the "far-field" or Fraunhofer region using interference between portions of a coherent light source as reflected from a phase spatial light modulator. Phase spatial light modulation is a form of light modulation where the reflected phase of each pixel determines the phase of the reflected light relative to other light reflected from other pixels of the phase spatial light modulator (PSLM). Therefore, if a PSLM shifts one pixel by one quarter wavelength, the light reflected from the first pixel is one quarter wavelength out of phase from the light reflected from a second unshifted pixel. The light from the first and second pixels then interferes in a controllable manner that that directs the combined light.

A PSLM may have thousands or millions of controllable pixels. A PSLM can project an image based on interference of the reflected coherent light directed by pixels of different phases. In contrast, a conventional amplitude spatial light modulator (SLM) reflects or does not reflect selected pixels to create the projected image. This PSLM projected image has several uses. It can scan a scene for a light detection and ranging (LIDAR) system with varying images by direction to aid in detection of objects in the scene. In other uses, a user views the image directly, such as with a heads-up display projected onto the windshield of a car.

With LIDAR, the PSLM scans holographic projection over a field-of-view. An amplitude-only SLM can accomplish this using an imaging configuration by turning on a single micromirror at a time, but the efficiency is very low (1/(number of pixels)). Another method of scanning the beam is to use an amplitude-only SLM to create a hologram, each hologram corresponding to a different beam position. However, this is typically only about 12% efficient due to attenuation, and the generation of unused diffraction orders. However, using a PSLM to create a virtual phase ramp, the efficiency can be much higher—approaching 100% in some cases. Rather than attenuate unneeded light, as with an SLM, the PSLM can manipulate the light wavefront to direct light to where it is needed. By manipulating the optical wavefront, the PSLM device can create an image at a distant plane (without a projection lens), or at some intermediate plane. In the case of an image on distant plane, the PSLM device takes advantage of the Fourier transform relationship at the Fraunhofer far-field plane. The PSLM device can also generate a digital hologram by introducing phase curvature, causing the light to focus at various intermediate distances.

SUMMARY

In accordance with an example, apparatus includes a driving electrode on a substrate. The apparatus has a platform suspended above the driving electrode and conductively coupled to a platform electrode, where the platform is configured to move in a direction perpendicular to a surface of the substrate in response to a voltage difference applied between the driving electrode and the platform electrode. The apparatus also has a mirror post on the platform. The apparatus has a mirror coupled to the platform by the mirror post, where the mirror is rectangular.

DETAILED DESCRIPTION

Figure 1:
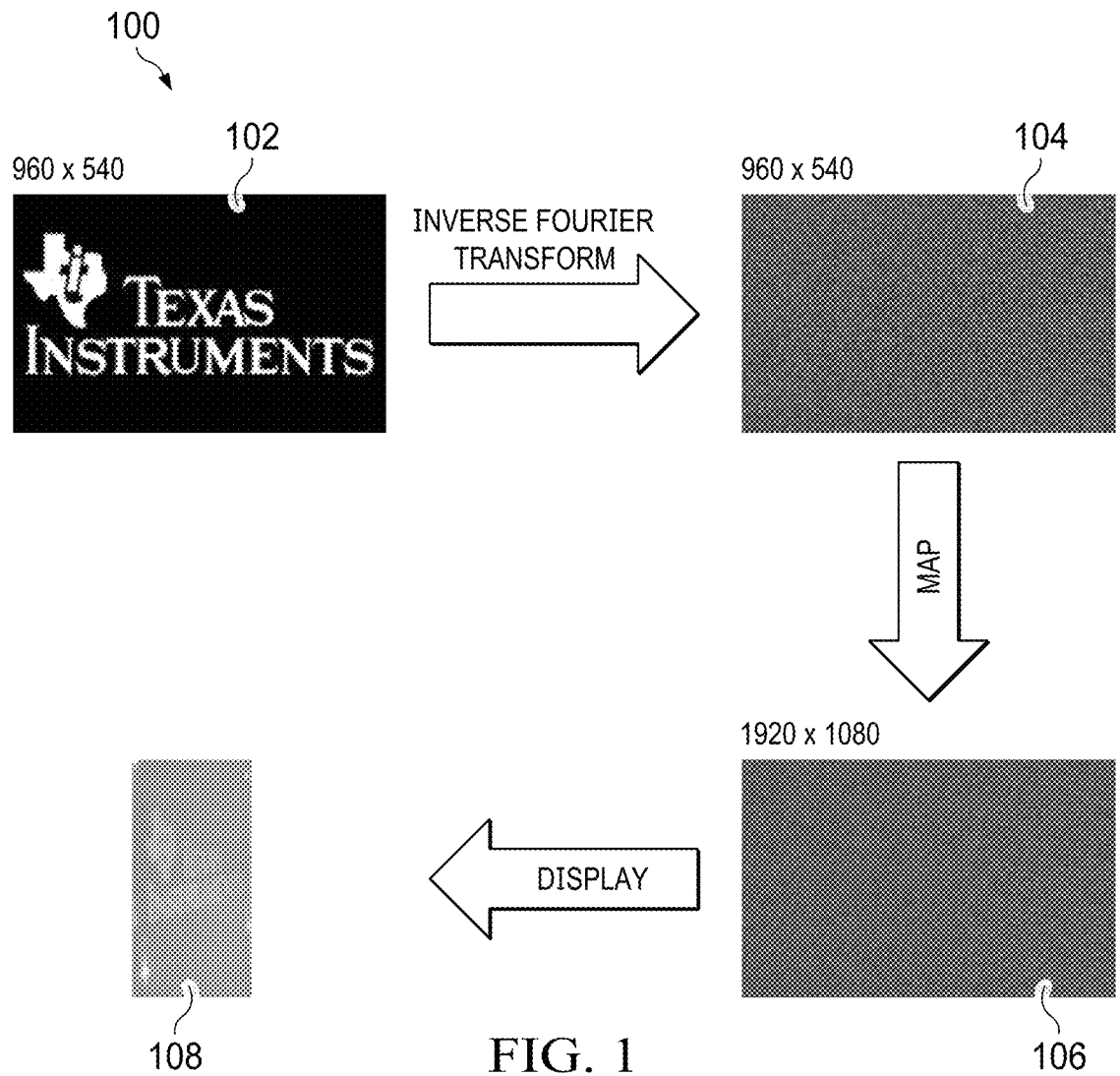
FIG. 1 is a diagram showing a process of projecting a holographic image.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled."

In this description, the term "phase spatial light modulator" (PSLM) is used. phase spatial light modulator (PSLM) describes a device consisting of an array of cells with each cell imparting a different optical phase delay depending on an electrical signal applied to each cell. A PSLM device can consist of a liquid crystal device (LCD), a liquid crystal on silicon device (LCOS) or a microelectromechanical system (MEMS) device. A MEMS PSLM typically consists of an array of small mirrors that are actuated to displace in a direction normal to an array plane. The function of a PSLM is to change the shape of the optical wavefront which is incident on the device. The PSLM can impart a linear phase delay on a wavefront which has the effect of steering the beam in a different direction. A PSLM can also impart a curved wavefront which can focus the wavefront similar to a lens. The primary advantage of a PSLM is that it can be quickly reconfigured to steer or focus a beam to a desired direction or focus to a desired plane.

The optical function of a PSLM in a LIDAR system is different from that of a digital micromirror device (DMD). When using the DMD in a receiver in a LIDAR system, light from the external scene is imaged onto the DMD array, and various pixels are turned on or off depending on whether the pixel is imaging laser light or background light. In the case of the PSLM, light falls onto the device without the aid of an imaging optic. Particular areas or points of interest within the scene can be selected by imposing a spatial wavefront pattern on the PSLM such that the region of interest is steered towards a detector. As a consequence, the light not in the region of interest is directed to an area away from the detector. In this manner, the PSLM can perform a similar function to the imaging DMD in directing laser light toward the detector while directing background light away from the detector.

The PSLM can be the same or similar device that is used to steer the LIDAR laser beam in the LIDAR system. A linear phase function can be displayed on the PSLM such that it directs the laser light in a desired direction. The phase front is altered for each beam direction causing the beam to scan in a particular pattern required to obtain range or reflectivity image of the scene. In a similar manner a different linear phase function can be displayed on the PSLM to direct the received light in a different direction toward the detector. Furthermore, by displaying a curved phase function on the PSLM, the beam can be focused at the detector.

In example arrangements, the problem of a form factor mismatch of holographically projected images using phase spatial light modulators is solved by providing a phase spatial light modulator having pixels with a form factor matching a desired form factor. In an example, apparatus includes a driving electrode on a substrate. The apparatus has a platform suspended above the driving electrode and conductively coupled to a platform electrode, where the platform is configured to move in a direction perpendicular to a surface of the substrate in response to a voltage difference applied between the driving electrode and the platform electrode. The apparatus also has a mirror post on the platform. In an example, the apparatus has a mirror coupled to the platform by the mirror post, where the mirror is rectangular.

FIG. 1 is a diagram showing a process 100 of projecting a holographic image 108. Algorithms for generating the PSLM image exploit the Fourier transform relationship between the PSLM phase image and the far-field image. In a simple example, an input image 102 is processed using an inverse fast Fourier transform (IFFT) to produce a frequency domain image 104. The frequency domain image 104 is processed using one of several processes map the frequency domain image 104 to produce a phase pattern 106 for input to a spatial light modulator. The mapping is done using one of several algorithms. Gerchberg and Saxton, "A practical algorithm for the determination of the phase from image and diffraction plane pictures," Optik 35, 237-246 (1972), which is hereby incorporated by reference in its entirety herein, describes an example algorithm. The mapping produces a phase pattern 106 that includes a phase assignment for each pixel of a phase spatial light modulator. A coherent light source, such as a laser (not shown), reflects off the phase spatial light modulator with pattern 106 to produce the image 108 in the far field or at a specified depth.

Figure 2:
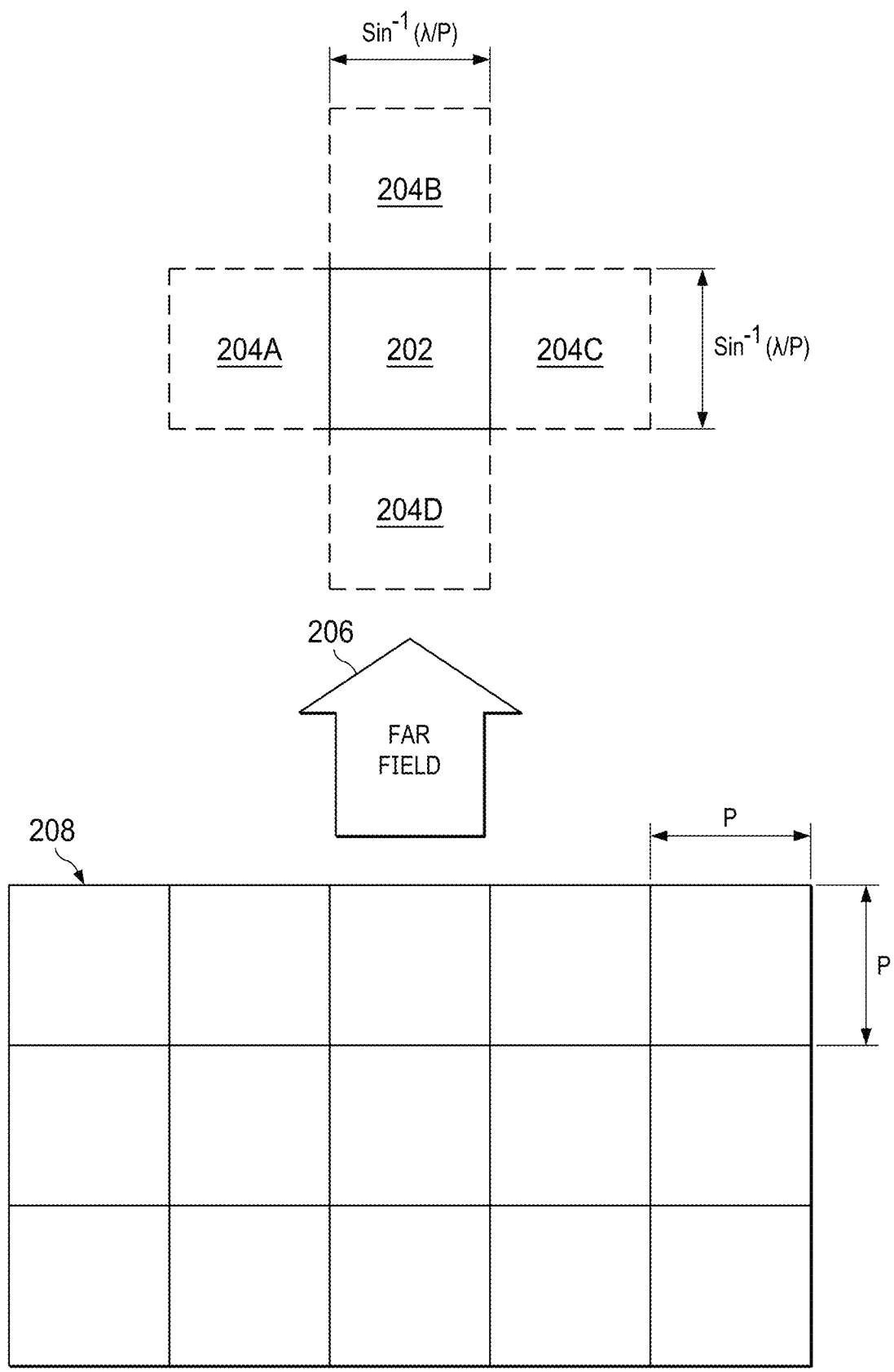
FIG. 2 is a diagram showing the output of a holographic projection using a phase spatial light modulator.

FIG. 2 is a diagram showing the output of holographic projection using a phase spatial light modulator 208. In this example, the projection creates the image in the far field. Coherent light reflects off PSLM 208, which has pixels that are P×P. The light reflects to the far field 206 where it produces image 202. Because the image is an interference pattern rather than a collection of pixels, the dimensions of image 202 is $\sin^{-1}(\lambda/P)$ on each side, where $\lambda$ is the wavelength of the light used to make the interference pattern and P is the x and y dimensions of the pixels of PSLM 208. In addition, the interference may produce artifact or shadow images 204A, 204B, 204C and 204D. The form factor of the image produced by interference is proportional to the form factor of the pixels of PSLM 208 and not the form factor of the arrangement of pixels on PSLM 208.

Figure 3:
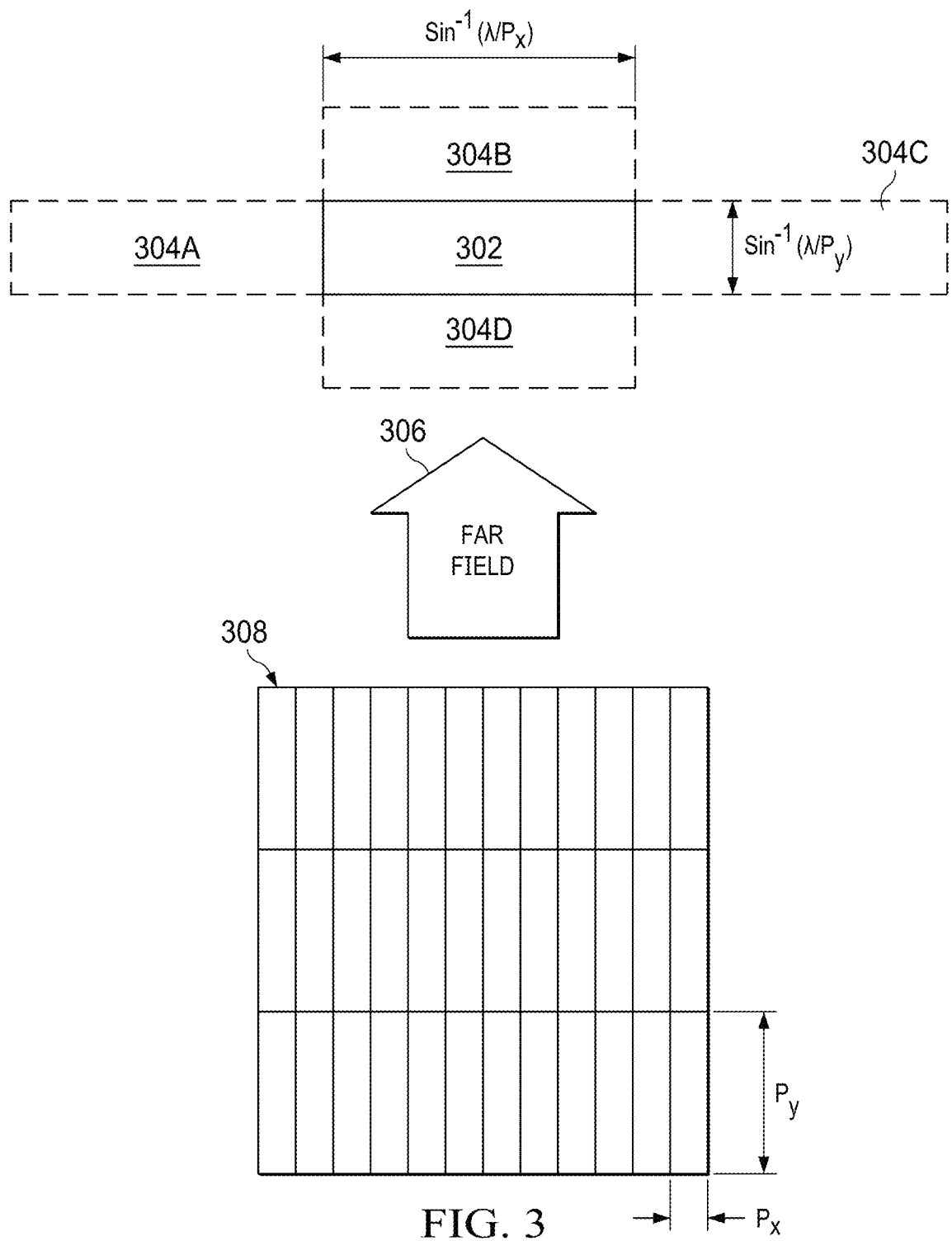
FIG. 3 is a diagram of an example holographic image.

FIG. 3 is a diagram of an example holographic image 302. PSLM 308 includes pixels having a y dimension of $P_y$ and an x dimension of $P_x$. Coherent light reflected from PSLM 308 produces image 302 in the far field 306, in this example. The resulting image 302 has an x dimension of $\sin^{-1}(\lambda/P_x)$ and a y dimension of $\sin^{-1}(\lambda/P_y)$. Thus, the x dimension of the pixels of PSLM 208 determines the x dimension of the image and the y dimension of the pixels of PSLM 208 determines the y dimension of image 302. In addition, the interference may produce artifact or shadow images 304A, 304B, 304C and 304D.

Figure 4:
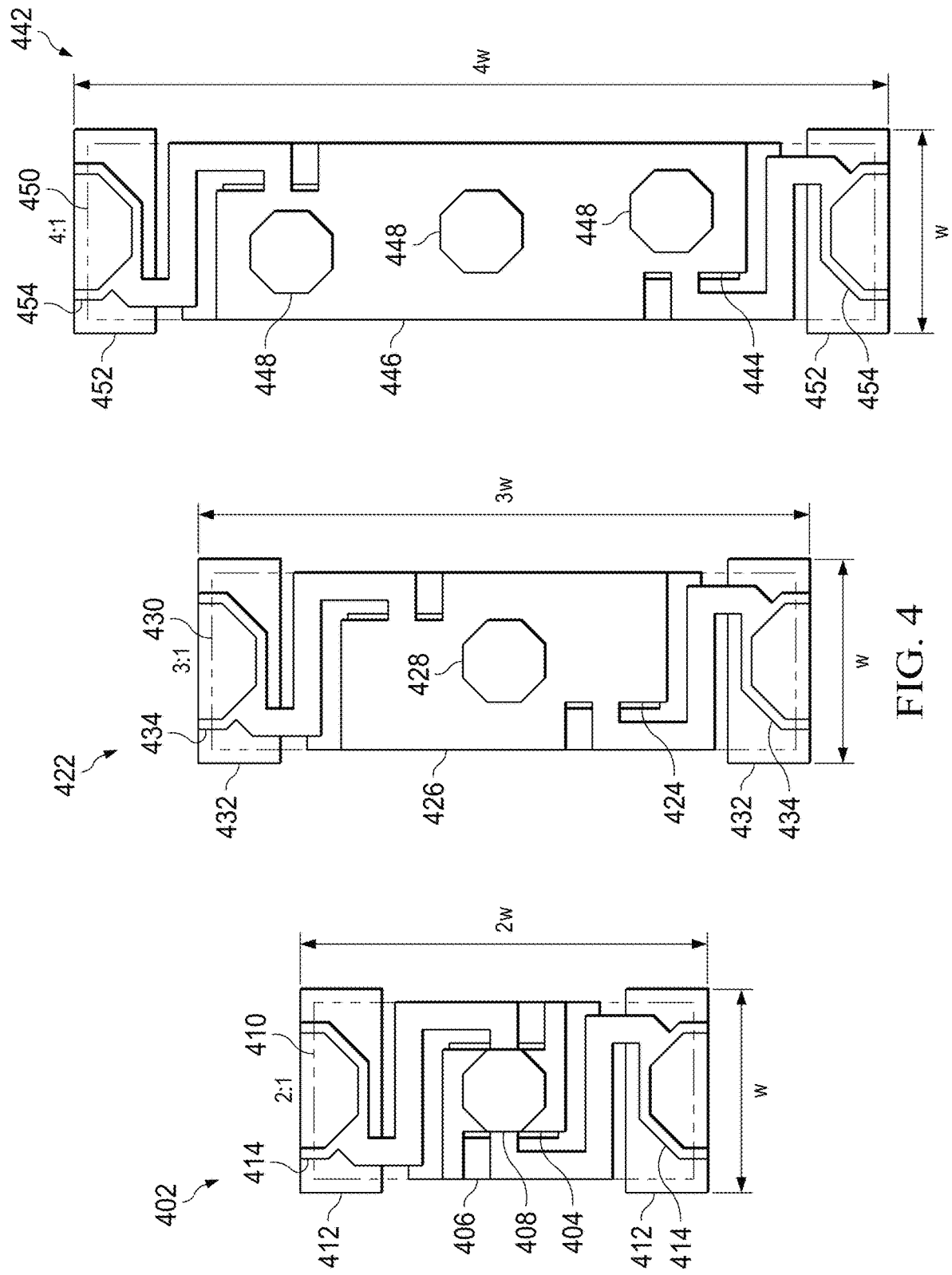
FIG. 4 is a diagram of three example pixels of example PSLMs.

FIG. 4 is a diagram of three example pixels 402, 422 and 442 of example PSLMs. FIG. 4 shows pixel mirrors 410, 430, 450 in outline to show the structure underlying the mirrors. Pixel 402 includes two platform posts 414 supporting and conductively connecting platform 404 to two platform electrodes 412. Platform 404 supports mirror 410 via post 408. Driving electrode 406 moves platform 404 vertically (into the page), as explained further below. Mirror 410, and thus pixel 402, has a 2:1 rectangular form factor. That is, if the width of mirror 410 is W, then the height of mirror 410 (the distance between platform posts 414) is 2 W. In an example, W is 0.5μ.

Pixel 422 includes two platform posts 434 supporting and conductively connecting platform 424 to two platform electrodes 432. Platform 424 supports mirror 430 via post 428. Driving electrodes 426 move platform 424 vertically (into the page), as explained further below. Mirror 430, and thus pixel 422, has a 3:1 rectangular form factor. That is, if the width of mirror 430 is W, then the height of mirror 430 (the distance between platform posts 434) is 3 W.

Pixel 442 includes two platform posts 454 supporting and conductively connecting platform 444 to two platform electrodes 452. Platform 444 supports mirror 450 via posts 448. As indicated in FIG. 4, the larger platform 444 allows for three posts 448 for greater stability. Whether rectangular (including square) or another form factor, multiple posts 448 provide additional stability for mirror 450 and help maintain vertical motion for mirror 450. Driving electrodes 446 move platform 444 vertically (into the page), as explained further below. Mirror 450, and thus pixel 442, has a 4:1 rectangular form factor. That is, if the width of mirror 450 is W, then the height of mirror 450 (the distance between platform posts 454) is 4 W.

Figure 5:
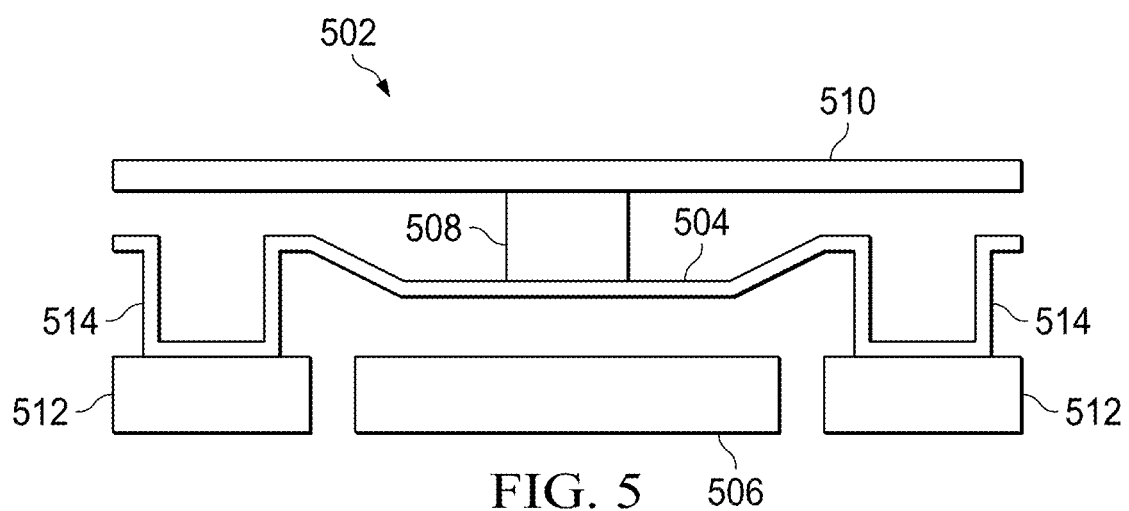
FIG. 5 is a sideview diagram of an example pixel.

FIG. 5 is a side view of an example pixel 502. Platform 504 connects to two platform electrodes 512 via platform posts 514. Post 508 supports mirror 510 above platform 504. As shown in FIG. 5, when a voltage is applied to driving electrode 506 and a reference voltage (e.g. ground) is applied to platform electrodes 512, an electrostatic force pulls platform 504, and thus mirror 510, down. The amount of movement is determined by the applied voltage. In other examples, pixel 502 uses two or more driving electrodes 506 that are individually addressable by driving circuitry (not shown). The applied electrostatic force is proportional to the area of a driving electrodes 506 and platform 504. Thus, using multiple electrodes the amount of force, and thus the vertical position of mirror 510 can be precisely controlled by selecting the driving electrode 506 or combination of driving electrodes 506, while applying the same voltage to each selected one of driving electrodes 506. The phase shift provided by pixel 502 is determined by the vertical positioning of mirror 510. For example, if a pixel lowers by one-quarter wavelength (¼ λ), light reflected from that pixel will travel an additional one-half wavelength (¼ λ, down to the mirror and ¼ λ, back) relative to a pixel that is not lower. In another example, if a pixel lowers by one-eighth wavelength (⅛ λ), light reflected from that pixel will travel an additional one-quarter wavelength (⅛ λ, down to the mirror and ⅛ λ, back) relative to a pixel that is not lowered. Using coherent light, these phase differences can be employed to create a holographic projection.

Figure 6:
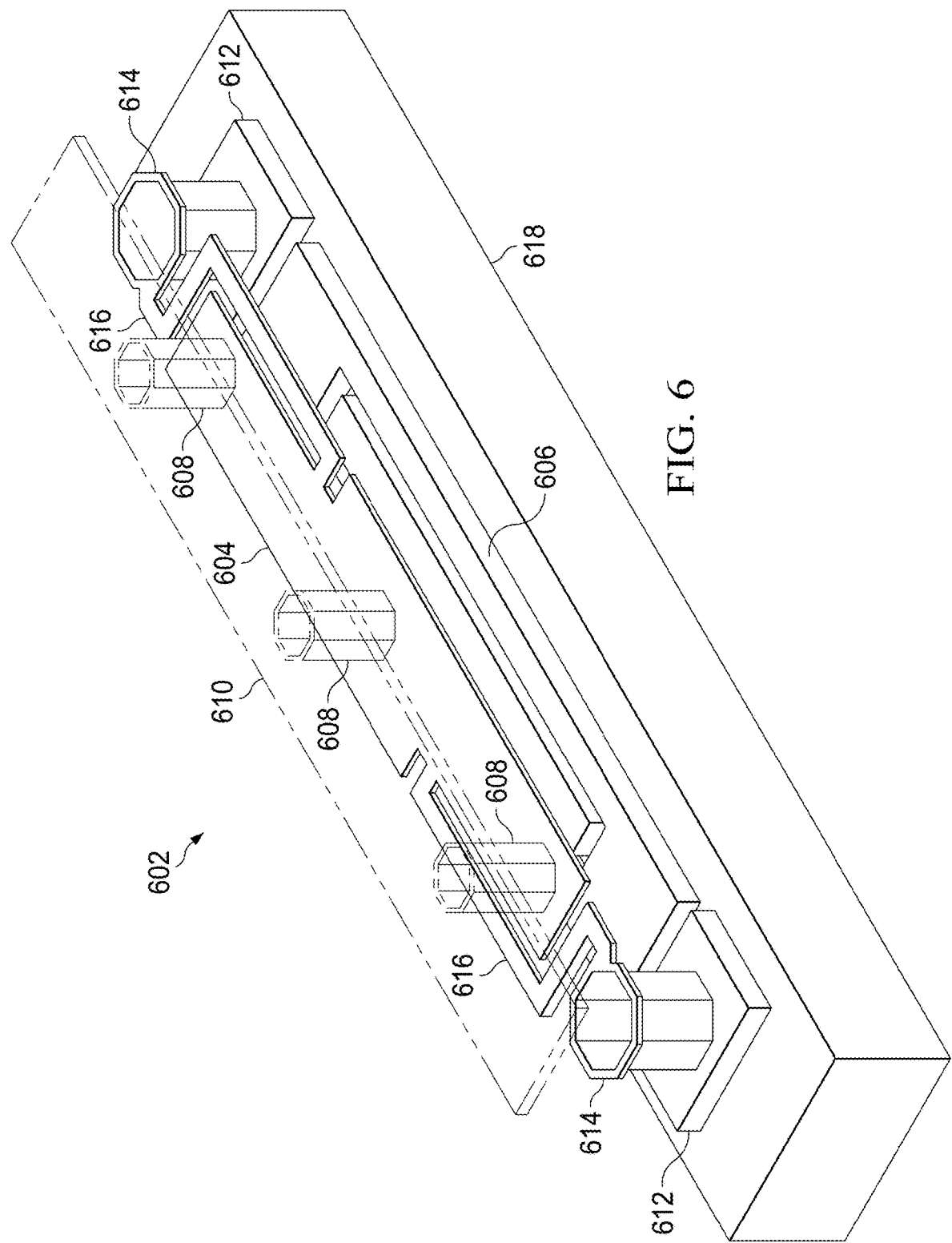
FIG. 6 is a perspective view on an example pixel.

FIG. 6 is a perspective view on an example pixel 602. In this example, the length of pixel 602 is eight times the width, which provides a form factor of 8:1. Two flexible hinges 616 and two platform posts 614 support platform 604. Platform posts 614 conductively couple to two platform electrodes 612. Mirror posts 608 support mirror 610 above platform 604. Driving electrodes 606 are below platform 604. Circuitry (not shown) in substrate 618 applies signals to platform electrodes 612 and driving electrodes 606 to position mirror 610, and thus increase the path length of light that mirror 610 reflects either by no increase or a distance selected to increase the path length by a selected fraction of a wavelength of the light. As noted above, driving electrodes 606 may be a single electrode or multiple electrodes, and may be driven by multiple voltages, by a single voltage applied to one or more of driving electrodes 606, or a combination thereof. Hinges 616 are in the same layer as platform 604 (as further explained hereinbelow) and attach at opposing sides of platform 604, in this example. Also, hinges 616 attach to platform 604 at a point that provides a distance between the attachment point and the platform post 614. Attachment of the hinges 616 on the sides of the platform parallel to a line between platform posts 614 reduces a twisting force on the platform 604 when balanced by a hinge 616 on the opposite side. The distance from posts 614 allows for more hinge flexibility and less stress on hinges 616 for a given deflection of platform 604.

Figure 7:
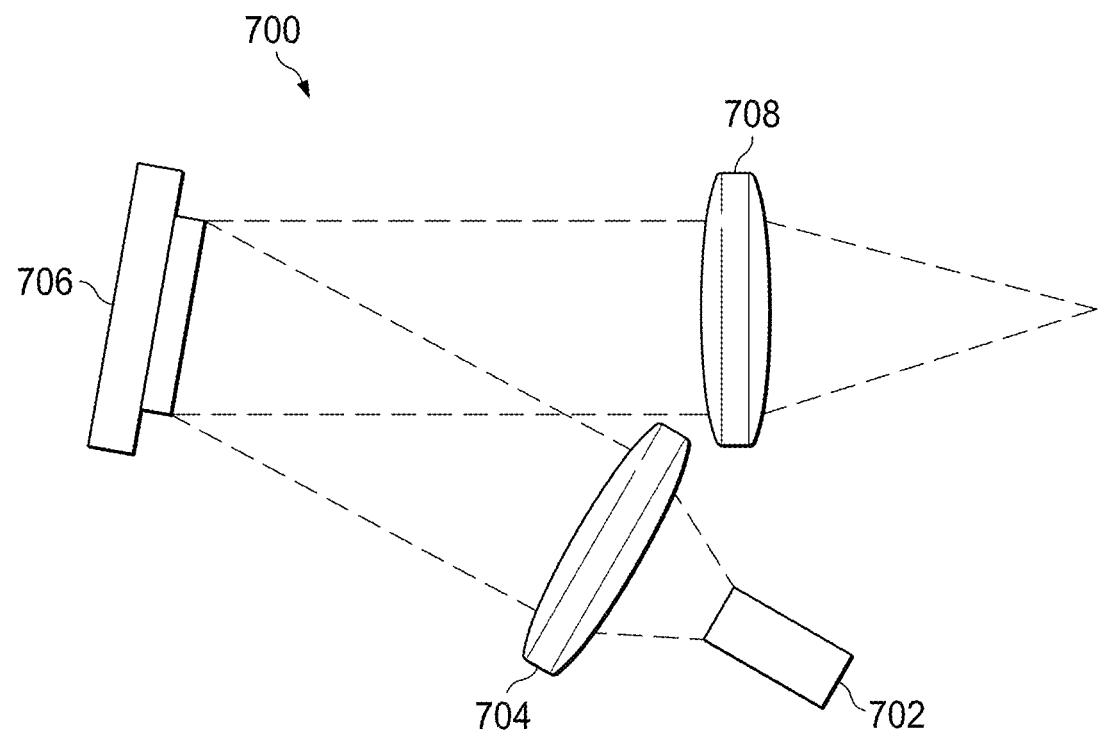
FIG. 7 is a diagram of an example projection system.

FIG. 7 is a diagram of an example projection system 700. Lens 704 collimates the light from light source 702 onto PSLM 706. Light source 702 is a source of coherent light, such as a laser or laser diode. To provide a full color gamut, light source can include several laser sources having different colors. The voltages applied to the pixels of the PSLM are adjusted for the different wavelengths of the different colors and the timing of the projection of the colors is interleaved to provide the desired color. Fresnel lens 708 is optional. PSLM 706 reflects the light through the Fresnel lens 708 and so outputs the light after the phase shift.

Figure 8:
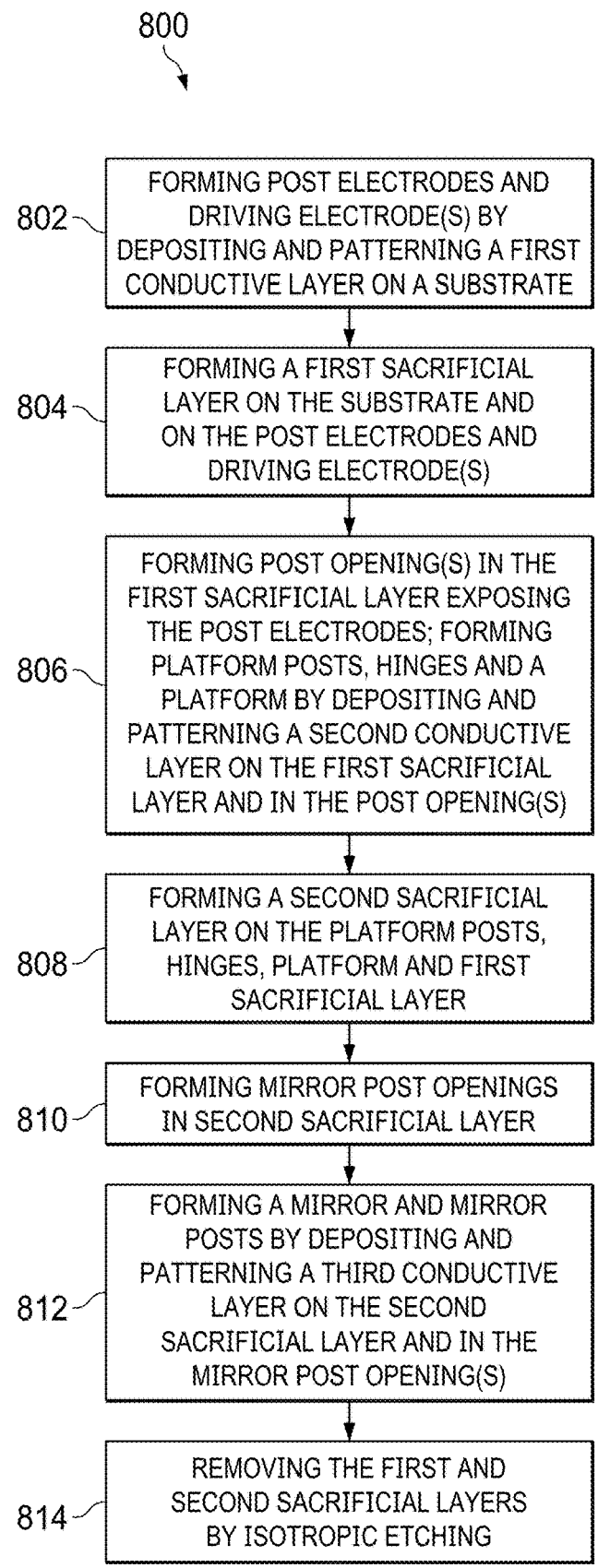
FIG. 8 is a diagram of a process flow for fabricating an example pixel in an example PSLM.
Figure 9A:
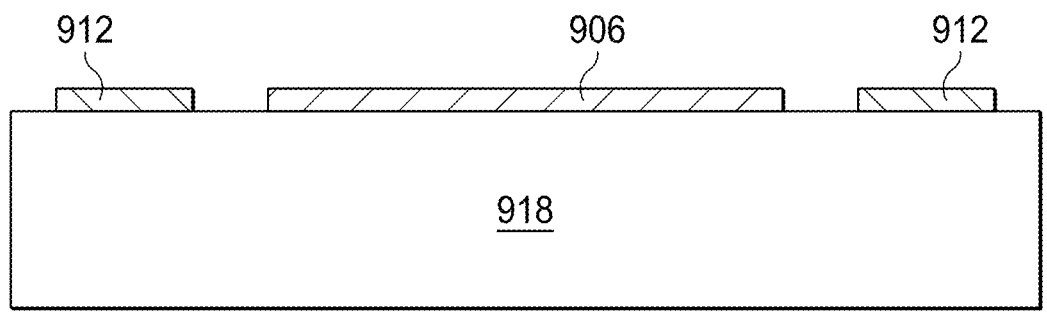
FIGS. 9A-H (collectively "FIG. 9") are diagrams illustrating the steps of the process flow of FIG. 8.
Figure 9B:
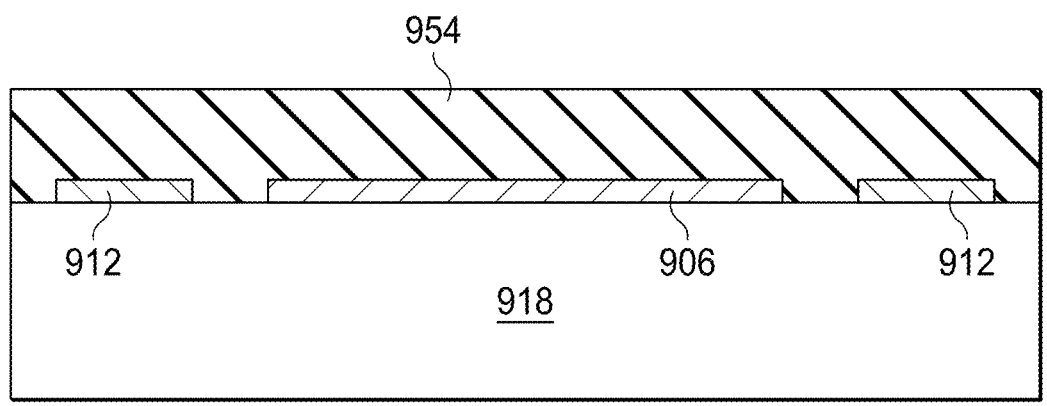

FIG. 8 is a diagram of process flow 800 for fabricating an example pixel in an example PSLM. FIGS. 9A-H (collectively "FIG. 9") illustrate in a series of cross sectional views the steps of process flow 800. Step 802 is forming platform electrodes and at least one driving electrode by depositing and patterning a first conductive layer on a substrate. As shown in FIG. 9A, in this step a process deposits and patterns a conductive layer, such as aluminum, titanium-aluminum, titanium or titanium nitride. Chemical vapor deposition (CVD) or physical vapor deposition (PVD) forms the conducive layer to a thickness of 300 to 400 Å, for example. Photolithography and etching patterns the conductive layer to form driving electrode 906 and platform electrodes 912 on substrate 918. Substrate 918 is an insulating layer on a semiconductor integrated circuit (not shown) that couples to and provides control signals to driving electrode 906 and platform electrodes 912. In an example, substrate 918 is silicon dioxide. Step 804 is forming a first sacrificial layer on the substrate and on the platform electrodes and driving electrode(s). Thus, first sacrificial layer 954 is formed on substrate 918, driving electrode(s) 906, and platform electrodes 912 as shown in FIG. 9B. Examples of materials for first sacrificial layer 954 include silicon dioxide, silicon nitride, photoresist, polyimide, germanium, germanium oxide, polycrystalline silicon, phosphor-silicate-glass (PSG), borophospho-silicate glass (BPSG) and spin-on-glass (SOG). The specific method used for forming first sacrificial layer 954 is dependent upon the material used. In an example, first sacrificial layer 954 is SOG that is spun-on to a thickness of 5,000 Å.

Figure 9C:
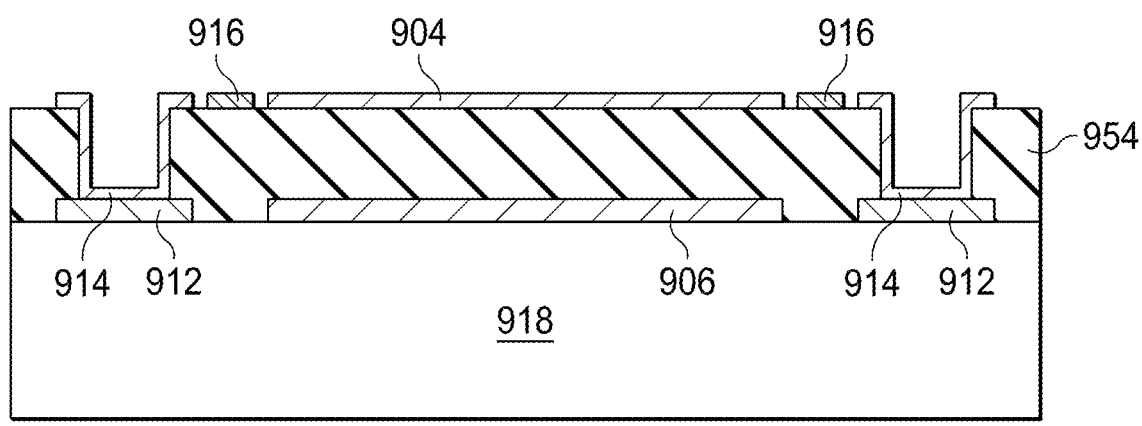
Figure 9D:
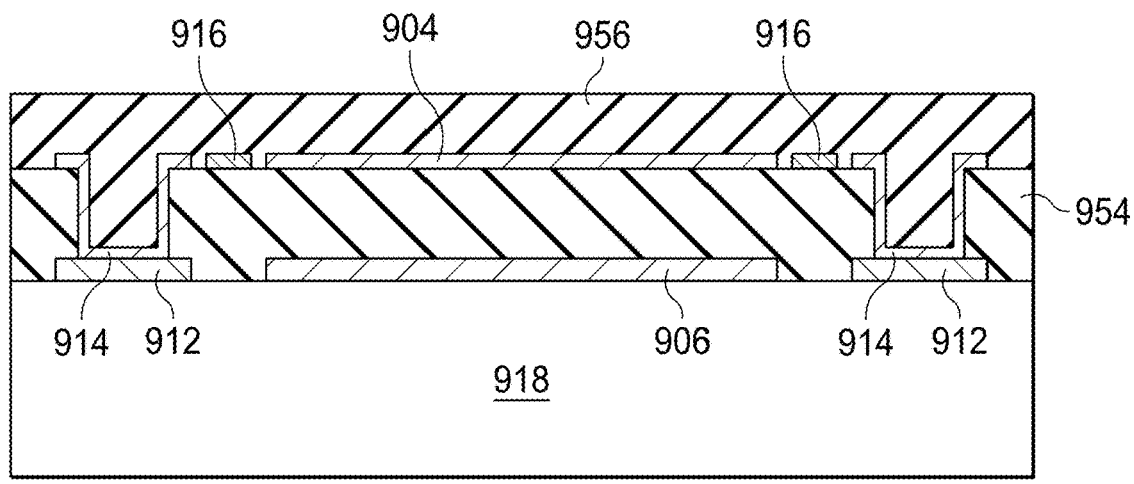
Figure 9E:
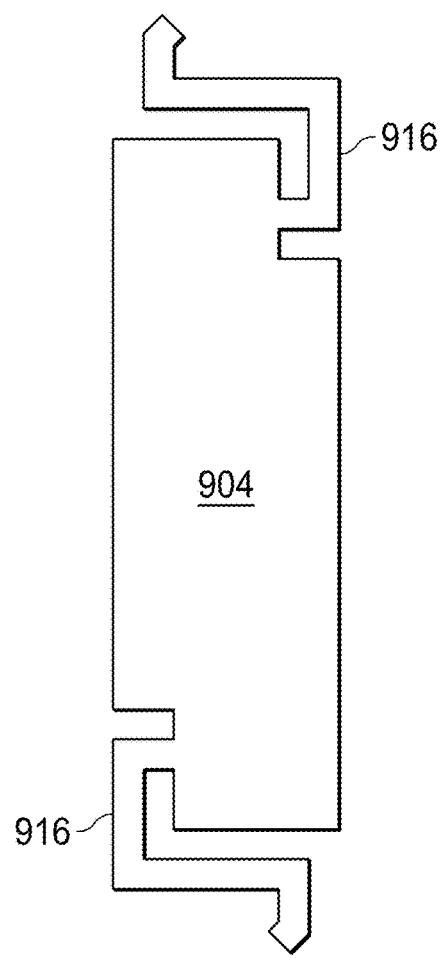

Step 806 is forming post opening(s) in first sacrificial layer 954 to expose the platform electrodes, and forming posts, hinges and a platform by depositing and patterning a second conductive layer on the first sacrificial layer and in the post opening(s). Thus, as shown in FIG. 9C, this step deposits a conductive layer, such as aluminum, titanium-aluminum, titanium or titanium nitride, using CVD or PVD to a thickness of 300 to 400 Å. The conductive layer is the patterned and etched using photolithography and etching. This step forms two platform posts 914 in contact with platform electrodes 912, hinges 916 and platform 904 on sacrificial layer 954. Step 808 is forming a second sacrificial layer on the posts, hinges, platform and first sacrificial layer. As shown in FIG. 9D, second sacrificial layer 956 is formed on posts 914, hinges 916, platform 904 and the exposed portions of first sacrificial layer 954 to a thickness of 5,000 Å, for example. Examples of materials for second sacrificial layer 956 include silicon dioxide, silicon nitride, photoresist, polyimide, germanium, germanium oxide, polycrystalline silicon, phosphor-silicate-glass (PSG), borophospho-silicate glass (BPSG) and spin-on-glass (SOG). FIG. 9E is a view of platform 904 and hinges 916 from the top of the page of FIG. 9D.

Figure 9F:
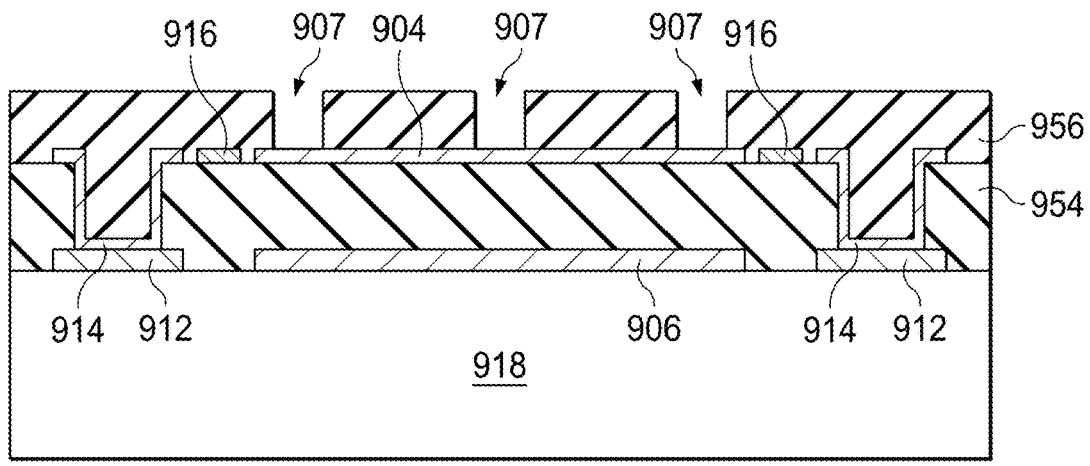
Figure 9G:
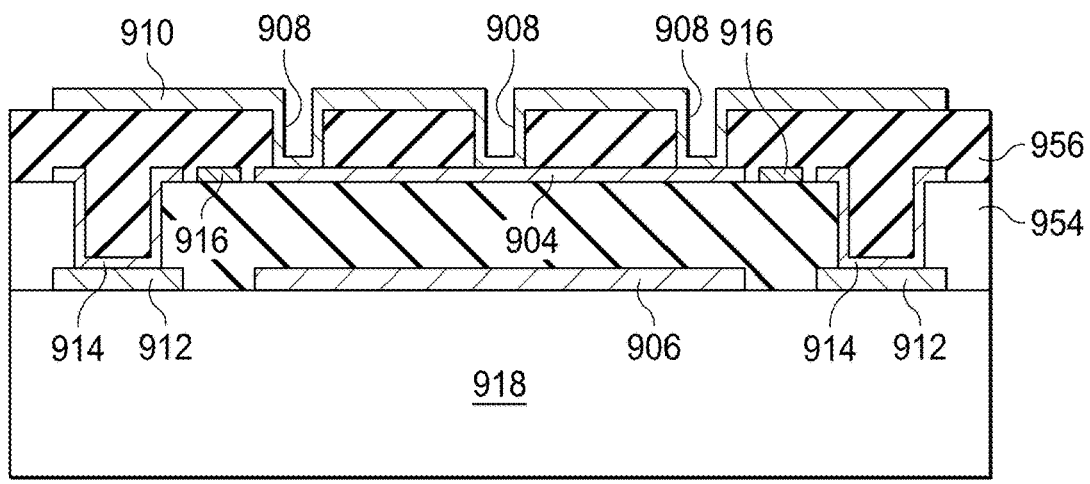
Figure 9H:
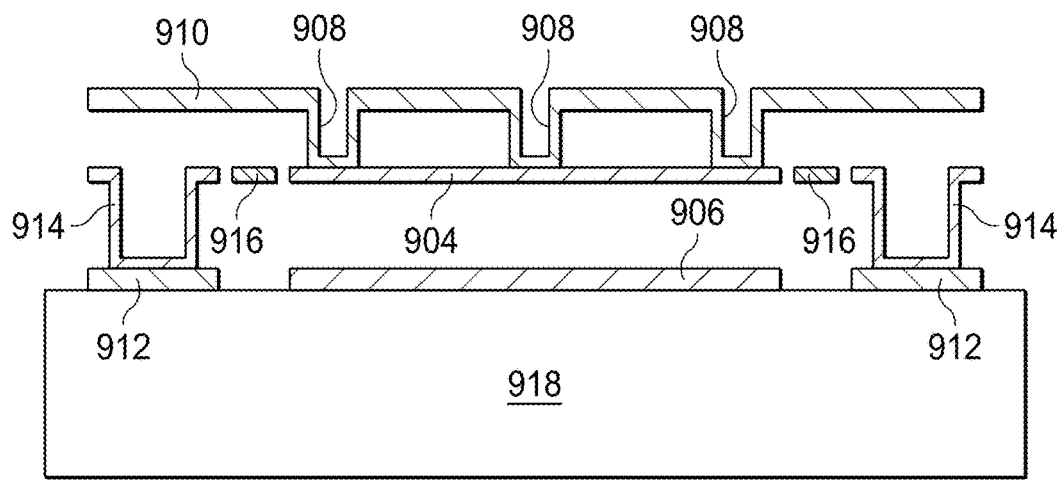

Step 810 is forming mirror post openings in the second sacrificial layer. As shown in FIG. 9F, photolithography and etching forms mirror post openings 907 in second sacrificial layer 956. Step 812 is forming a mirror and mirror posts by depositing a third conductive layer to a thickness of 300 to 400 Å, and patterning and etching the third conductive layer on the second sacrificial layer and in the mirror post opening(s). As shown in FIG. 9G, mirror 910 is on second sacrificial layer 956 and mirror posts 908 are on platform 904 in openings 907. Step 814 is removing the first and second sacrificial layers by isotropic etching leaving the structure shown in FIG. 9H.

Modifications are possible in the described examples, and other examples are possible, within the scope of the claims.

What is claimed is:

1. An apparatus comprising:
   an electrode layer comprising:
      a driving electrode on a substrate; and
      a platform electrode on the substrate;
   a platform post on the platform electrode;
   a hinge layer above the electrode layer, the hinge layer comprising:
      a platform coupled to the platform post, the platform above the driving electrode, the platform having a first side facing a first direction and a second side facing a second direction, the second side adjacent the first side; and
      a hinge having a first end coupled to the platform post and a second end coupled to the second side of the platform, the hinge having a portion between the platform post and the first side of the platform; and
   a mirror coupled to the platform.

2. The apparatus of claim 1, wherein the platform post is a first platform post and the hinge is a first hinge, the apparatus further comprising:
   a second platform post and
   a second hinge coupling the second platform post to the first side of the platform, wherein the first platform post is adjacent a third side of the platform and the second platform post is adjacent a fourth side of the platform.

3. The apparatus of claim 2, wherein the first side of the platform and the second side of the platform are parallel to a line between the first platform post and the second platform post.

4. The apparatus of claim 2, wherein the first hinge, the second hinge, and the platform are contiguous.

5. The apparatus of claim 1, wherein the driving electrode is two or more electrodes.

6. The apparatus of claim 5, wherein the two or more electrodes are individually addressable.

7. The apparatus of claim 1, further comprising:
a mirror post on the platform and supporting the mirror.

8. A projection system comprising:
a light source configured to produce light;
a phase spatial light modulator optically coupled to the light source, the phase spatial light modulator including:
an electrode layer comprising:
a driving electrode on a substrate;
a platform electrode on the substrate;
a platform post on the platform electrode;
a hinge layer above the electrode layer, the hinge layer comprising:
a platform above the driving electrode, the platform having a first side facing a first direction and a second side facing a second direction, the second side of the platform adjacent the first side of the platform; and
a hinge having a first end coupled to the platform post and a second end coupled to the second side of the platform, the hinge having a portion between the platform post and the first side of the platform;
a mirror post on the platform; and
a mirror coupled to the platform by the mirror post.

9. The projection system of claim 8, wherein the platform post is a first platform post and the hinge is a first hinge, the phase spatial light modulator further comprising:
a second platform post and
a second hinge coupling the second platform post to the first side of the platform, wherein the first platform post is adjacent a third side of the platform and the second platform post is adjacent a fourth side of the platform.

10. The projection system of claim 9, wherein first side of the platform and the second side of the platform are parallel to a line between the first platform post and the second platform post.

11. The projection system of claim 9, wherein the first hinge, the second hinge, and the platform are contiguous.

12. The projection system of claim 8, wherein the light source is a coherent light source.

13. The projection system of claim 8 wherein the light source is a laser diode.

14. The projection system of claim 8, wherein the driving electrode is two or more electrodes.

15. The projection system of claim 14, wherein the two or more electrodes are individually addressable.

16. A device comprising a pixel, the pixel comprising:
an electrode layer comprising:
a driving electrode; and
a platform electrode;
a platform post on the platform electrode, the platform post having a first side and a second side opposite the first side;
a hinge layer over the electrode layer, the hinge layer comprising:
a platform having a first side and a second side opposite the first side, the platform over the driving electrode, the first side of the platform and the first side of the platform post on a first side of the pixel, the second side of the platform and the second side of the platform post on a second side of the pixel; and
a hinge coupling the first side of the platform post to the second side of the platform;
a mirror; and
a mirror post coupling the mirror and the platform.

17. The device of claim 16, wherein the mirror has a length and a width, wherein the width is different than the length.

18. The device of claim 17, wherein the length is at least two times the width.

19. The device of claim 16, wherein the platform electrode is a first platform electrode, the platform post is a first platform post, and the hinge is a first hinge, the platform having a first end and a second end opposite the first end, the first hinge coupled to the first end of the platform, the device further comprising:
a second platform electrode;
a second platform post having the first side and the second side, the second platform post coupled to the second platform electrode; and
a second hinge coupling the first side of the second end of the platform to the second side of the second platform post.

20. The device of claim 16, wherein the mirror post is a first mirror post, the device further comprising:
a second mirror post coupling the mirror and the platform; and
a third mirror post coupling the mirror and the platform.

* * * * *